(12) United States Patent
Kalathil et al.

(10) Patent No.: US 9,182,459 B2
(45) Date of Patent: Nov. 10, 2015

(54) WIRELESS MAGNETIC POSITION SENSOR

(75) Inventors: Sankaranarayanan Kalathil, Bangalore (IN); Kumaran Sena Narasimhan, Bangalore (IN)

(73) Assignee: Honeywell International Inc., Morristown, NJ (US)

( * ) Notice: Subject to any disclaimer, the term of this patent is extended or adjusted under 35 U.S.C. 154(b) by 617 days.

(21) Appl. No.: 13/228,013

(22) Filed: Sep. 8, 2011

(65) Prior Publication Data

US 2013/0066587 A1 Mar. 14, 2013

(51) Int. Cl.
| G01B 7/00 | (2006.01) |
| G01R 33/09 | (2006.01) |
| G01D 5/06 | (2006.01) |
| G01D 5/14 | (2006.01) |

(52) U.S. Cl.
CPC ............... G01R 33/098 (2013.01); G01D 5/06 (2013.01); G01D 5/145 (2013.01)

(58) Field of Classification Search
CPC ............................... G01D 5/06; G01R 33/098
USPC .................................................. 702/155, 150
See application file for complete search history.

(56) References Cited

U.S. PATENT DOCUMENTS

| 5,589,769 | A | 12/1996 | Krahn |
| 6,097,183 | A | 8/2000 | Goetz et al. |
| 6,833,697 | B2 | 12/2004 | Van Ostrand et al. |
| 7,394,247 | B1 | 7/2008 | Guo et al. |
| 7,408,343 | B2 * | 8/2008 | Dmytriw et al. ............ 324/252 |
| 7,444,872 | B2 | 11/2008 | Shoji |
| 7,551,657 | B2 | 6/2009 | Nurmikko |
| 7,583,081 | B2 | 9/2009 | Schmitt et al. |
| 7,926,193 | B2 | 4/2011 | Peczalski |
| 2003/0006764 | A1 * | 1/2003 | Kou ............................... 324/252 |
| 2004/0160205 | A1 * | 8/2004 | Robb et al. .................... 318/468 |
| 2007/0096723 | A1 * | 5/2007 | Rieger et al. ............. 324/207.24 |
| 2007/0164264 | A1 | 7/2007 | Lenssen et al. |
| 2007/0269905 | A1 | 11/2007 | Bangert |
| 2008/0012557 | A1 | 1/2008 | Hammerschmidt |
| 2008/0138660 | A1 | 6/2008 | Parkin |
| 2010/0085041 | A1 * | 4/2010 | Pozidis et al. ............ 324/207.21 |
| 2010/0127696 | A1 * | 5/2010 | Huber et al. ............. 324/207.21 |
| 2010/0176799 | A1 * | 7/2010 | Ausserlechner ........... 324/207.2 |
| 2010/0223797 | A1 | 9/2010 | Pexzalski |
| 2011/0025318 | A1 * | 2/2011 | Saruki et al. .................. 324/252 |
| 2013/0015845 | A1 * | 1/2013 | Fox .......................... 324/207.21 |

OTHER PUBLICATIONS

Jaffres et al., "Angular Dependence of the Tunnel Magnetoresistance in Transition-Metal-Based Junctions," Physical Review B, vol. 64, 7 pages, 2001.

Eichardt et al., "Influence of Sensor Variations on the Condition of the Magnetostatic Linear Inverse Problem," IEEE Transactions on Magnetics, vol. 46, No. 8, 4 pages, Aug. 2010.

(Continued)

Primary Examiner — Janet Suglo
Assistant Examiner — Stephanie Bloss
(74) Attorney, Agent, or Firm — Craige Thompson; Thompson Patent Law

(57) ABSTRACT

In one example, a position sensor is provided. The position sensor comprises an integrated circuit, and a magnetic field sensor that provides a detected signal indicative of a position of a magnetic field source to the integrated circuit. The magnetic field sensor comprises a tunneling magnetoresistance (TMR) sensor. The position sensor further comprises a wireless circuit coupled to the integrated circuit, wherein the wireless circuit comprises an antenna configured to radiate a position signal based on the detected signal.

16 Claims, 8 Drawing Sheets

(56) References Cited

OTHER PUBLICATIONS

Albon et al., "Tunneling Magnetoresistance Sensors for High Resolutive Particle Detection," Applied Physics Letters 95, 3 pages, 2009.

Negulescu et al., "Wide Range and Tunable Linear Magnetic Tunnel Junction Sensor Using Two Exchange Pinned Electrodes," Applied Physics Letters 95, 3 pages, 2009.

NVE Corporation, Data Sheet, "AAT001-10E TMR Angle Sensor," Sep. 21, 2009, 4 pages.

* cited by examiner

WIRELESS MAGNETIC POSITION SENSOR

TECHNICAL FIELD

The disclosure relates to magnetic field sensors, and more particularly, to magnetic field sensors configured to sense a position of a magnetic field source.

BACKGROUND

Some magnetic position sensors are used to determine a linear or rotary position of a device. Such a device may be, for example, a shaft, gear, or other movable device. To determine a position of the device, a magnetic field position sensor is sometimes used in conjunction with a magnet attached to the device. In some cases, the magnetic field position sensor is positioned proximate to the device such that the magnet passes by the magnetic field position sensor as the device moves relative to the sensor.

SUMMARY

In one example, a position sensor is described. The position sensor comprises an integrated circuit and a magnetic field sensor that outputs a detected signal indicative of a position of a magnetic field source to the integrated circuit. The magnetic field sensor comprises a tunneling magnetoresistance (TMR) sensor. The position sensor further includes a wireless circuit coupled to the integrated circuit, wherein the wireless circuit comprises a transmitter configured to radiate a position signal based on the detected signal. In some examples, the position sensor may be a wireless rotary position sensor or a wireless linear position sensor.

In another example, this disclosure describes a system comprising a magnetic field source that creates a magnetic field. The system also includes a position sensor in proximity to the magnetic field source, wherein the position sensor is configured to determine a position of the magnetic field source. The linear position sensor comprises a magnetic field sensor that detects the magnetic field and generates a signal indicative of a position of the magnetic field source. The magnetic field sensor may comprise a tunneling magnetoresistance (TMR) sensor. The position sensor further comprises an integrated circuit configured to process the signal indicative of the position of the magnetic field source and a wireless circuit coupled to the integrated circuit.

In a further example, a method for determining position is described. The method includes detecting, by a magnetic field sensor, a magnetic field of a magnetic field source, wherein the magnetic field sensor is a tunneling magnetoresistance (TMR) sensor. The method further includes generating a signal indicative of a position of the magnetic field source based on the detected magnetic field. The method additionally includes calculating, by a processing unit coupled to the magnetic field sensor, a linear position signal from the signal indicative of the position of the magnetic field source. The method further includes wirelessly transmitting the position signal by a wireless unit coupled to the processing unit.

The details of one or more examples of the disclosure are set forth in the accompanying drawings and the description below. Other features, objects, and advantages of the disclosure will be apparent from the description and drawings, and from the claims.

Figure 1:
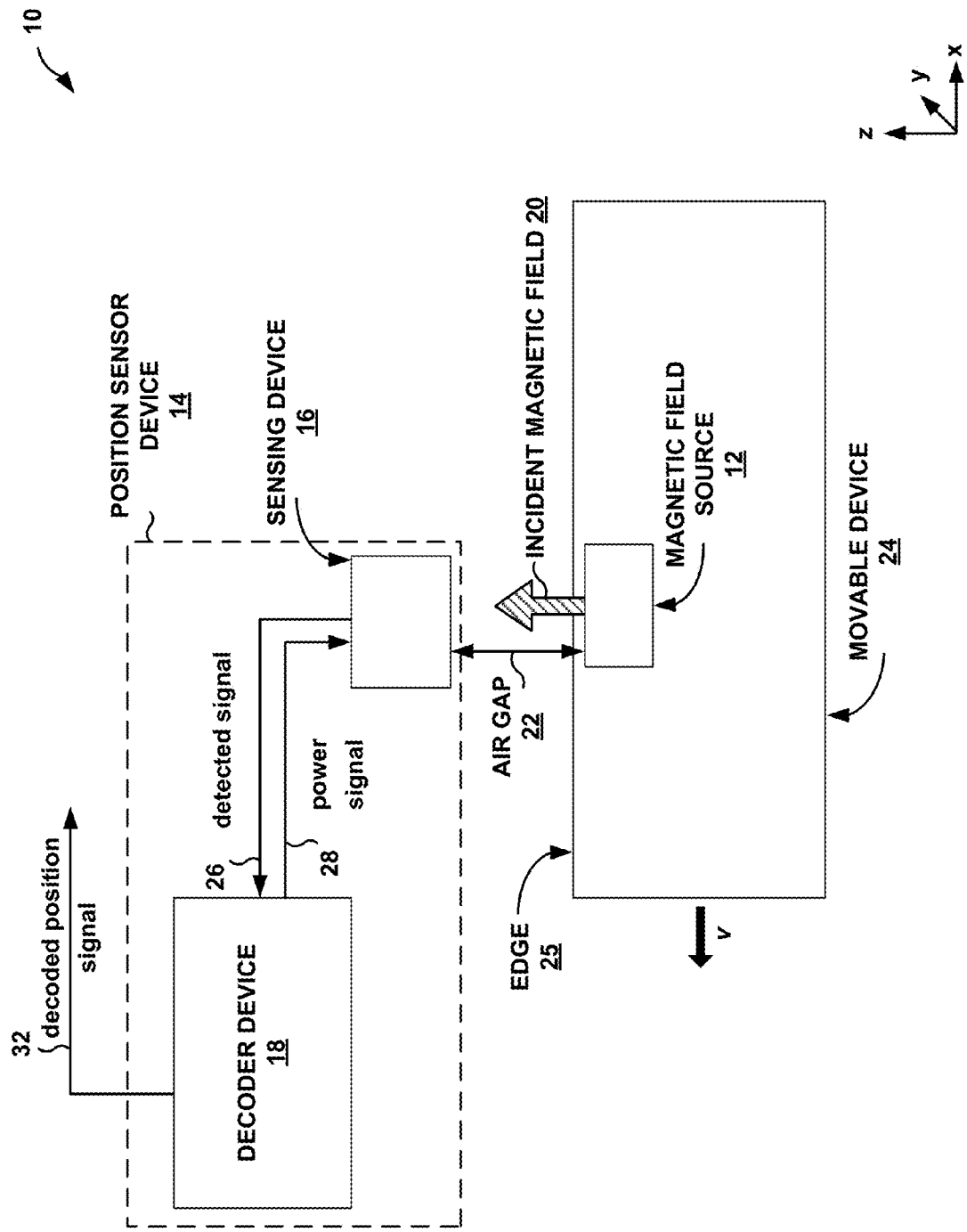
FIG. 1 is a block diagram illustrating one example of a system for determining a position of a magnetic field source, in accordance with one or more aspects of this disclosure.

The details of one or more aspects of the disclosure are set forth in the accompanying drawings and the description below. Other features, objects, and advantages of the techniques described in this disclosure will be apparent from the description and drawings below, and from the claims. The various described features are necessarily not drawn to scale in the figures, and may be drawn to emphasize features relevant to this disclosure. Like reference characters denote like elements throughout the figures and text.

DETAILED DESCRIPTION

This disclosure is directed to techniques for wireless magnetic field position sensing. The techniques may involve the use of a magnetoresistive sensor and an integrated circuit to form a position sensor. The position sensor may be configured to generate signals indicative of a position of an incident magnetic field. The magnetoresistive sensor of the position sensor may be located proximate to a magnetic field source such that the magnetic field of the magnetic field source is incident upon the magnetoresistive sensor. The magnetic field source may be affixed to a moving device. The position of the incident magnetic field may be correlated with a position of the moving device. The position sensor may determine a linear position of the magnetic field source or an angular position of the magnetic field source.

The magnetoresistive sensor may detect a signal indicative of a linear or angular position of the magnetic field. An approximately linear portion of the detected signal may be used to determine the position of the magnetic field source or even of a device the magnetic field source is affixed to. The signal indicative of the position of the incident magnetic field may be conditioned such that a position signal is generated from the approximately linear portion of the detected signal. The position signal may be wirelessly transmitted from the position sensor. In an example where the position sensor is a linear position sensor, an approximate 10 mm linear range is achieved with a single sensing chip. In an example where the position sensor is an angular position sensor, an approximate 180° angular range is achieved with a single sensing chip.

FIG. 1 is a block diagram illustrating one example of a system 10 for determining a position of a magnetic field source 12, in accordance with one or more aspects of the present disclosure. Magnetic field position sensing system 10 is configured to generate a decoded position signal 32 related to the position of magnetic field source 12. Magnetic field position sensing system 10 includes magnetic field source 12 and a position sensor device 14. Magnetic field source 12 is magnetically coupled to position sensor device 14 via an incident magnetic field 20. Magnetic field position sensing system 10 may determine a linear or angular position of magnetic field source 12.

Magnetic position sensing involves the use of magnetic sensors to generate an indication of the position of a movable magnetic field to determine a position of an incident magnetic field. One or more of the magnetic field position sensors may be magnetoresistive sensors. Magnetoresistivity is a change in the resistivity of a ferromagnetic material in the presence of a magnetic field. Magnetoresistive sensors output a signal related to the strength or orientation of an incident magnetic field. A magnetoresistive sensor may output an analog sinusoidal signal where a portion of the detected signal may be approximately linear.

Magnetic field source 12 may be affixed or otherwise attached to a movable device 24. In particular, magnetic field source 12 may be affixed to movable device 24 in many different ways, including bolting, screwing, gluing, or any other means of attachment. In some examples, affixing magnetic field source 12 to movable device 24 may be performed to a selected level of precision. Precise attachment of the magnetic field source 12 may ensure that magnetic field source 12 is at least approximately positioned on a selected location of movable device 24. Precise and permanent attachment may also ensure that the position of the magnetic field source 12 with respect to the movable device 24 remains approximately constant over a lifetime of magnetic field position sensing system 10.

Movable device 24 may be any device that is free to move in space relative to position sensor device 14. Movable device 24 may rotate, move in a linear manner, a curvilinear manner, about one or more axes, or combinations thereof. In one example, movable device 24 may move in along a fixed approximately linear path. As shown in FIG. 1, movable device 24 may move past position sensor device 14 with a velocity, v, corresponding to an x direction. The velocity of movable device 24 may vary in some cases. Movable device 24 may comprise a shaft, a gear, an axle, or the like. In other examples, magnetic field source 12 is not affixed to movable device 24. In such examples, position sensor device 14 may move instead of, or in addition to, movable device 24. In other words, in different examples, either position sensor device 14, magnetic field source 12, or both, may move relative to one another.

Magnetic field source 12 is configured to generate incident magnetic field 20. Magnetic field source 12 may move along a linear or circular path as it is fixed to movable device 24. In other examples, magnetic field source 12 may take a circular path as it is fixed to movable device 24. In some examples, movable device 24 may move along a path that repeatedly brings it proximate to position sensing device 14. Movable device 24 may move back and forth on a path proximate to position sensing device 14. As magnetic field source 12 moves, incident magnetic field 20 also moves. Thus, the position of incident magnetic field 20 may be indicative of the position of magnetic field source 12, and thus of a position of movable device 24. In particular, each position of incident magnetic field 20 may correspond to a linear or angular position of magnetic field source 12. In some examples, a direction of motion of incident magnetic field 20 may be approximately the same direction of motion as that of movable device 24.

Magnetic field source 12 may be formed from any type of magnetic source configured to generate incident magnetic field 20. In some examples, magnetic field source 12 may comprise a bar magnet, cylindrical magnet, ring magnet, or any other type of device configured to generate a magnetic field. In further examples, the incident magnetic field 20 generated by magnetic field source 12 may be of sufficient strength to saturate a magnetoresistive sensor contained within linear position sensor device 14. In further examples, the strength of incident magnetic field 20 may be anywhere between approximately 20 to approximately 2000 Gauss ("G"), or greater, for an example where a magnetoresistive sensor is a tunneling magnetoresistive (TMR) sensor. In other examples, incident magnetic field 20 may have other field strengths.

Position sensor device 14 may be configured to receive incident magnetic field 20 and to generate decoded position signal 32. In some examples, decoded position signal 32 may be an output signal corresponding to a position that is substantially equal to the position of incident magnetic field 20. In additional examples, decoded position signal 32 may vary with respect to a change in the field strength of incident magnetic field 20. For example, decoded position signal 32 may be related to, but not directly indicative of, a linear or angular position of magnetic field source 12. In such an example, a field strength of magnetic field source 12 may vary depending on a distance movable device 24 is from position sensor device 14.

Position sensor device 14 may include sensing device 16 and a decoder device 18. Sensing device 16 may be communicatively coupled to decoder device 18. Sensing device 16 may be configured to sense incident magnetic field 20 and to generate at least a detected signal 26. In some examples, sensing device 16 and decoder device 18 may be affixed or attached to a common mounting device or substrate. The mounting device may define the plane of sensitivity for sensing device 16.

In some examples, the position of incident magnetic field 20 may correspond to the position of those components of incident magnetic field 20 that are perpendicular to a plane of sensitivity of sensing device 16. The plane of sensitivity may, in some examples, correspond to a plane of sensitivity of a magnetoresistive sensor contained within sensing device 16, e.g., a plane defined by a Wheatstone bridge configuration within sensing device 16. In further examples, a fixed position may be defined for sensing device 16 within the plane of sensitivity and the position of incident magnetic field 20 may be the position of incident magnetic field 20 relative to a fixed position of sensing device 16. As shown in FIG. 1, magnetic field source 12 may move in along an x-axis. The plane of sensitivity of sensing device 16 may also be in a plane including the x-axis.

Sensing device 16 may receive a power signal 28 from decoder device 18. In another example, sensing device 16 receives power signal 28 from a power source external to decider device 18 or even external to position sensor device 14. In some examples, power signal 28 provides microwatts to sensing device 16.

Sensing device 16 may include a magnetoresistive sensor. A magnetoresistive sensor may be configured to generate detected position signal 26. As an example, the magnetoresistive sensor may comprise a tunneling magnetoresistive (TMR) sensor. A TMR sensor may be configured to generate a detected position signal, such as detected signal 26. In some examples, sensing device 16 comprises two or more magnetoresistive sensors. One or more of the magnetic field position sensors may be an anisotropic magnetoresistive (AMR) sensor, a giant magnetoresistive (GMR) sensor, a Hall sensor, or another type of magnetic sensor. A TMR or AMR sensor may include resistive elements that are configured into one or more Wheatstone bridge configurations. As discussed herein, a Wheatstone bridge or TMR sensor may be referred to as a "bridge," wherein the signals produced are bridge signals.

In the example shown in FIG. 1, sensing device 16 may be approximately coplanar with magnetic field source 12. Sensing device 16 may be offset from magnetic field source 12 by a distance referred to as an air gap. An air gap may define a distance between a sensor, such as sensing device 16, and a source, such as magnetic field source 12. As shown in FIG. 1, sensing device 16 is offset from magnetic field source 12 by air gap 22. In some examples, air gap 22 may range from 5 to 15 mm. For such an air gap 22, a corresponding size and strength of magnetic field source 12 may be 12×4×3.5 mm and 45 megagauss-oersteds (MGOe), respectively.

Figure 2:
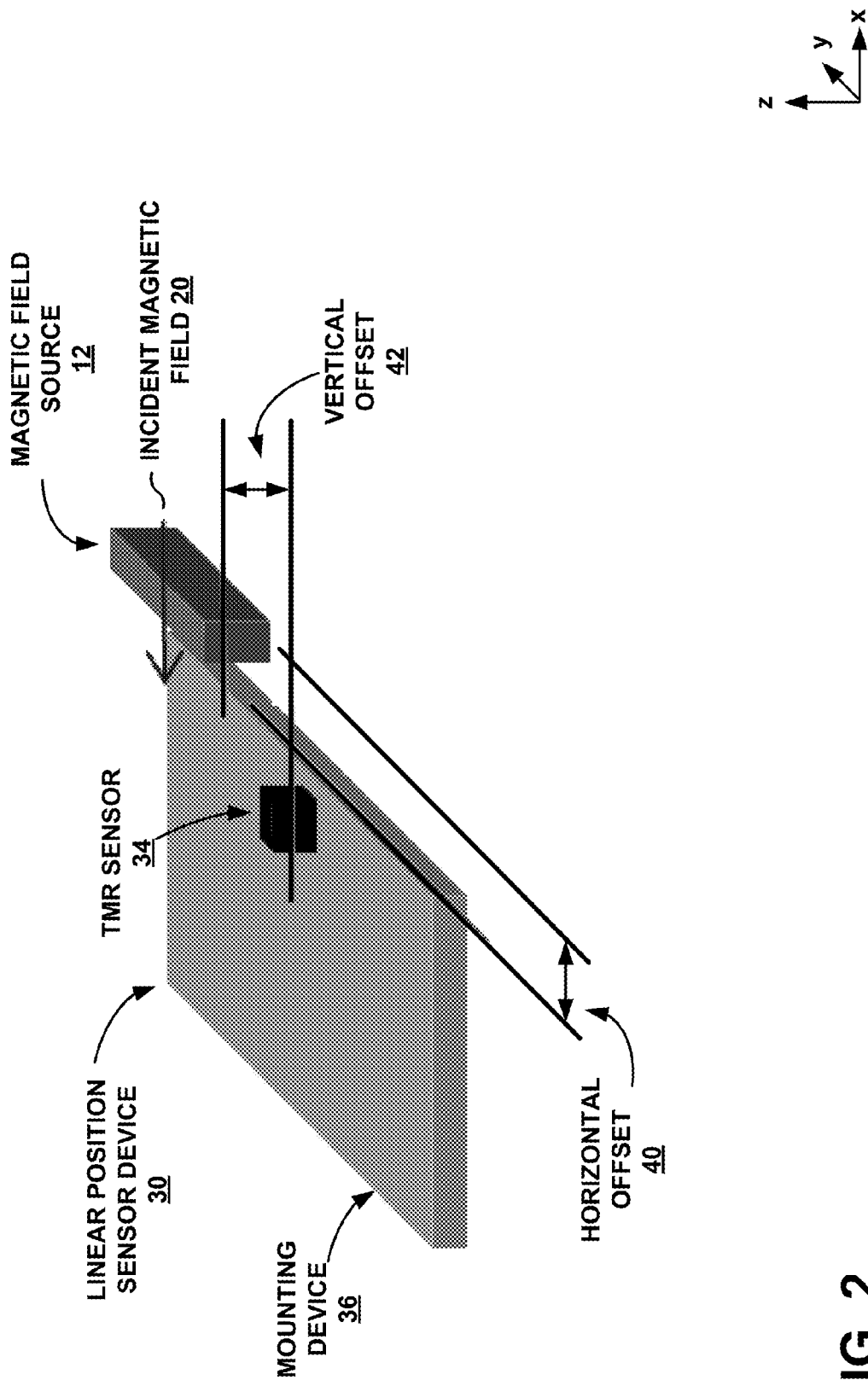
FIG. 2 is a block diagram illustrating one example of a linear position sensor device offset from a magnetic field source, in accordance with one or more aspects of this disclosure.

In some examples, sensing device 16 may not be coplanar with magnetic field source 12. FIG. 2 illustrates such an example. FIG. 2 is a block diagram illustrating one example of a linear position sensor device 30 offset from a magnetic field source 12, in accordance with one or more aspects of the present disclosure. Magnetic field source 12 and sensing device 16 of FIG. 2 may be the same as or similar to like components of FIG. 1. Linear position senor device 30 may be similar to position sensor device 14 of FIG. 1.

As shown in FIG. 2, linear position sensor device 30 includes a mounting device 36 which includes a TMR sensor 34. Mounting device 36 may be positioned such that magnetic field source 12 moves near TMR sensor 34. Mounting device 36 may be any device that sensors or circuitry, such as TMR sensor 34, may be mounted on. In some examples, mounting device 26 includes a substrate, a printed circuit board (PCB), a substrate mounting PCB, or the like. Magnetic field source 12 may have an incident magnetic field 20 that TMR sensor 34 detects as magnetic field source 12 moves along mounting device 36. A magnetization direction of incident magnetic field 20 may be perpendicular to a sensing plane of TMR sensor 34. In other examples, the magnetization direction may have other orientations with respect to TMR sensor 34. Magnetic field source 12 may be mounted on a device, such as movable device 24 of FIG. 1.

TMR sensor 34 may be offset from magnetic field source 12. TMR sensor 34 may be separated from magnetic field source 12 by a horizontal offset 40 and a vertical offset 42. Horizontal offset 40 and vertical offset 42 are not necessarily indicative of any particular orientation, but are named such in order to indicate two orthogonal directions. Therefore, horizontal offset 40 and vertical offset 42 may be defined in any direction. However, as shown in the example of FIG. 2, horizontal offset 40 may be in an x-direction and vertical offset 42 may be in a y-direction.

In one example, horizontal offset 40 may be any distance between approximately 5 millimeters (mm) to approximately 15 mm. Vertical offset 42 may be approximately around 5 mm. In other examples, TMR sensor 34 may be offset from magnetic field source 12 in any direction by other distances. In yet further examples, horizontal offset 40 or vertical offset 42 may change at different points along a path of travel of magnetic field source 12. An air gap between TMR sensor 34 and magnetic field source 12, such as air gap 22 shown in FIG. 1, may be measured in many different ways, including a diagonal distance, a horizontal distance, a vertical distance, or any other measurement between TMR sensor 34 and magnetic field source 12.

Figure 3:
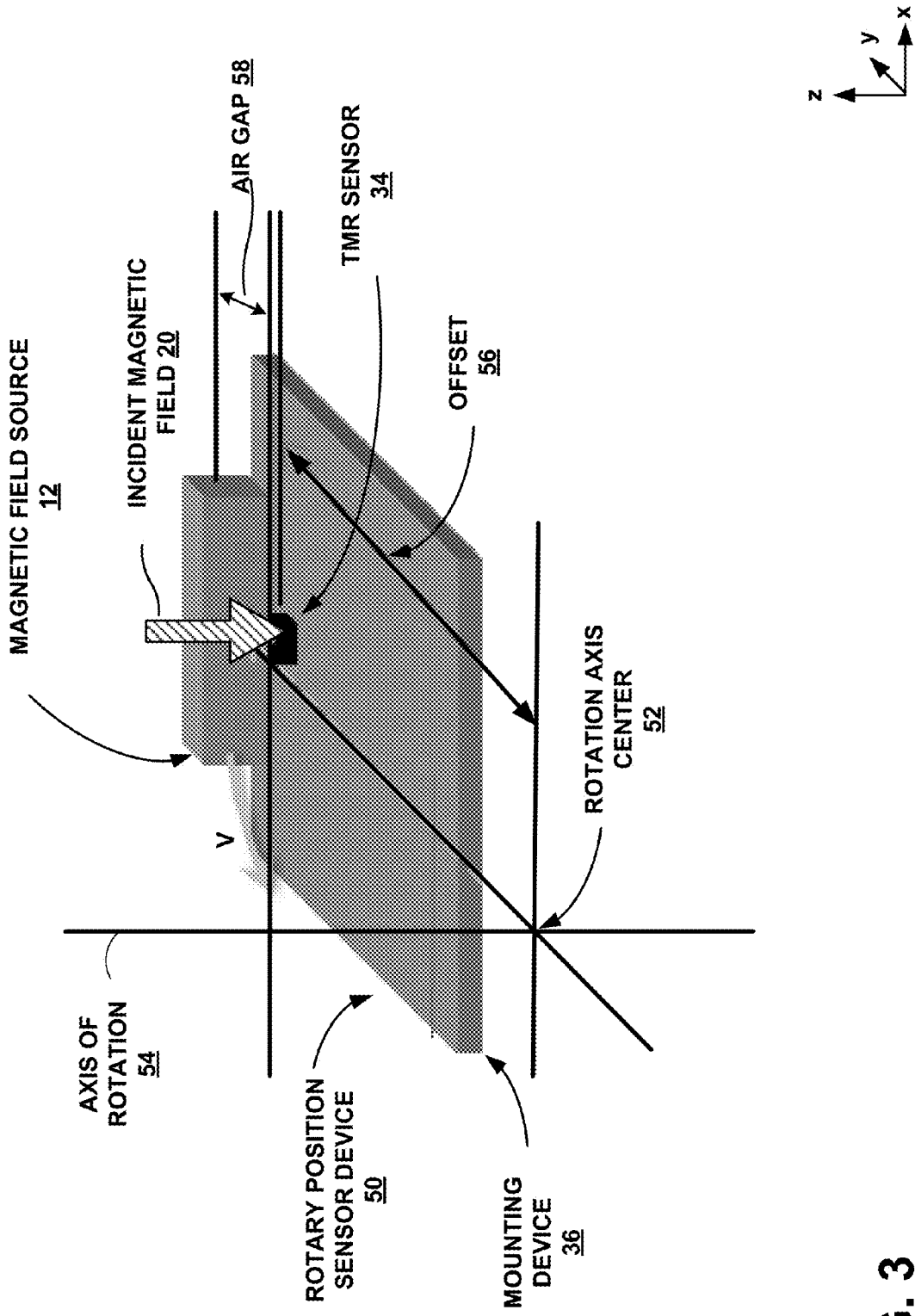
FIG. 3 is a block diagram illustrating one example of a rotary position sensor device offset from a magnetic field source, in accordance with one or more aspects of this disclosure.

FIG. 3 is a block diagram illustrating one example of a rotary position sensor device 50 offset from a magnetic field source 12, in accordance with one or more aspects of this disclosure. Magnetic field source 12, incident magnetic field 20, and sensing device 16 of FIG. 3 may be the same as or similar to like components of FIGS. 1 and 2. Rotary position sensor device 50 may be the same or similar to position sensor device 14 of FIG. 1. TMR sensor 34 and mounting device 36 may be the same or similar to like components of FIG. 2.

As shown in FIG. 3, magnetic field source 12 may be a rectangular magnet that rotates about an axis of rotation 54. A rotation axis center 52 may be a point upon which magnetic field source 12 rotates around. Rotation axis center 52 may lie in a sensing plane of TMR sensor 34. As shown in FIG. 2, axis of rotation 54 is in a z direction and the sensing plane of TMR sensor 34 is in an x-y plane.

Rotary position sensor device 14 includes a mounting device 36 which includes a TMR sensor 34. Mounting device 36 may be a TMR chip and may also include a processing unit and wireless circuitry. Mounting device 36 may be positioned such that magnetic field source 12 moves near TMR sensor 34 as magnetic field source 12 rotates about rotation axis center 52. TMR sensor 34 may be located a distance from rotation axis center 52 by an offset 56. Offset 56 may be within sensing distance of any radius of a circle of rotating incident magnetic field 20. In the example of FIG. 2, offset 56 may be approximately 7 millimeters (mm).

Magnetic field source 12 may have an incident magnetic field 20 that TMR sensor 34 detects as magnetic field source 12 sweeps past mounting device 36. A magnetization direction of incident magnetic field 20 may be perpendicular to a sensing plane of TMR sensor 34, as shown in FIG. 2, where the direction of incident magnetic field 20 is shown in the z direction. In other examples, the magnetization direction may have other orientations with respect to TMR sensor 34. Magnetic field source 12 may be mounted on a device, such as movable device 24 of FIG. 1.

TMR sensor 34 may be offset from magnetic field source 12. TMR sensor 34 may be separated from magnetic field source 12 by a horizontal offset and a vertical offset. The horizontal and vertical offsets are not necessarily indicative of any particular orientation, but are named such in order to indicate two orthogonal directions. Therefore, the horizontal vertical offsets may be defined in any direction. In one example, magnetic field source 12 may be horizontally offset from TMR sensor 34 by approximately 5 mm to approximately 15 mm and vertically offset from TMR sensor 34 by approximately 5 mm. In other examples, other offsets are possible. In other examples, TMR sensor 34 may be offset from magnetic field source 12 in any direction by other distances. In yet further examples, the offsets may change at different points along a path of travel of magnetic field source 12.

An air gap 58 between TMR sensor 34 and magnetic field source 12 may be approximately 5 millimeters (mm) to approximately 15 mm. Other air gaps 58 are contemplated and may depend on a sensitivity of TMR sensor 34. Air gap 58 may be measured in many different ways, including a diagonal distance, a horizontal distance, a vertical distance, or any other measurement between TMR sensor 34 and magnetic field source 12.

Returning to FIG. 1, magnetic field source 12 may be affixed to movable device 24 near an edge 25 of movable device 24. Locating magnetic field source 12 near edge 25 may increase the strength of incident magnetic field 20 that sensing device 16 is exposed to, as opposed to placing magnetic field source 12 further away from where movable device 24 passes sensing device 16. In other examples where movable device 24 rotates, magnetic field source 12 may be located proximate to a center of rotation of movable device 24. Locating sensing device 16 approximately over, adjacent to, or proximate to magnetic field source 12 may ensure sensing device 16 is within a detectable physical range of incident magnetic field 20.

Sensing device 16 may output detected signal 26, which is indicative of a linear or angular position of magnetic field source 12. Detected signal 26 may be an analog signal. Detected signal 26 may be a sinusoidal signal. Decoder device 18 may receive detected signal 26 and perform signal processing on detected signal 26 to generate decoded position signal 32. Decoded position signal 32 is also referred to herein as a position signal. An approximately linear portion of the sinusoidal output of sensing device 16, that is, detected signal 26, may be modified by decoder device 18. Decoder device 18 may include a microcontroller to perform this modification of the sinusoidal output of sensing device 16. Decoder device 18 may convert the approximately linear portion of detected signal 26 to a digital signal. The digital signal may be adjusted, modified, or calibrated to determine an absolute position of magnetic field source 12. Decoder device 18 may output decoded position signal 32, which may be a digital signal that is indicative of a position of movable device 24.

Decoded position signal 32 may comprise a digital signal indicative of the position of magnetic field source 12. Decoded position signal 32 may also comprise an analog signal indicative of the position of magnetic field source 12. In some examples, decoded position signal 32 provides an absolute position of magnetic field source 12. An absolute position sensor may be able to distinguish between the poles of incident magnetic field 20.

In some examples, decoder device 18 may generate decoded position signal 32 at least in part by implementing a Fourier series analysis of detected signal 26. Detected signal 26 may be further linearized using the Fourier series. In such examples, decoder device 18 may be referred to herein as a digital decoder device 18. When implementing a digital Fourier series, decoder device 18 may use sequential circuit elements to implement the Fourier series. As used herein, sequential circuit elements refer to circuit elements that retain a particular state after the inputs to the circuit elements are unasserted. For example, decoder device 18 may use a lookup table stored within a memory or register bank to implement the linearization with the Fourier series.

In further examples, decoder device 18 may implement an analog Fourier series analysis. In such examples, decoder device 18 may be referred to herein as an analog decoder device 18. When implementing an analog Fourier series analysis, decoder device 18 may use non-sequential circuit elements to implement the Fourier series. As used herein, non-sequential circuit elements refer to circuit elements that do not retain a particular state after the inputs to the circuit elements are unasserted. For example, decoder device 18 may use combinational circuit elements to implement the Fourier series.

In some examples, position sensor device 14 may include decoder device 18 and sensing device 16 in a single package. In other examples, sensing device 16 comprises a single package including at least one magnetic field position sensor, wherein decoder device 18 is located external to the package.

In other examples, sensing device 16 comprises a single package including at least one magnetic field position sensor.

Figure 4:
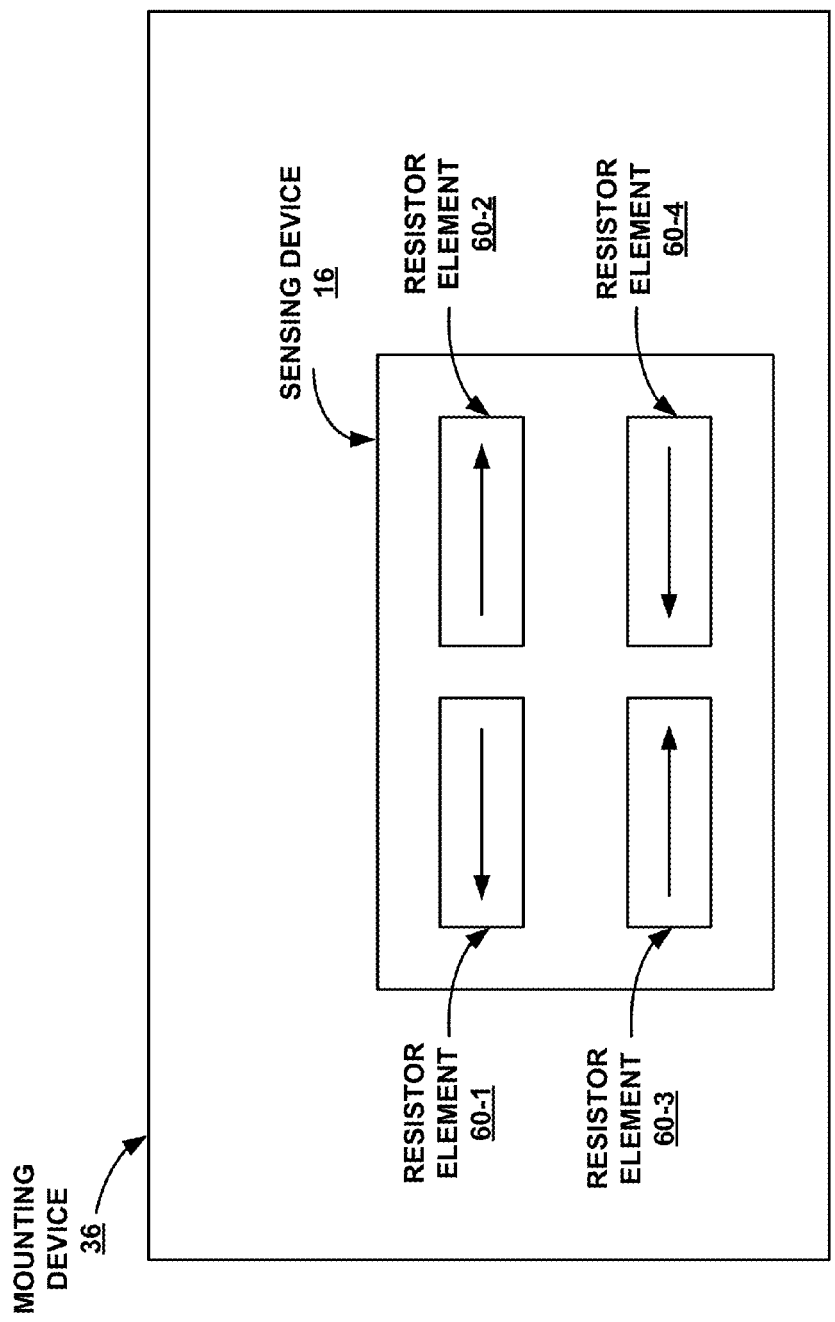
FIG. 4 is a diagram illustrating reference layer magnetization of four magnetoresistive sensors arranged in a bridge configuration, in accordance with one or more aspects of this disclosure.

FIG. 4 is a diagram illustrating reference layer magnetization of four magnetoresistive resistors 60-1 through 60-4 arranged in a bridge configuration, in accordance with one or more aspects of the present disclosure. FIG. 4 shows a portion of a mounting device 36 including sensing device 16. Mounting device 36 and sensing device 16 of FIG. 4 may be the same as or similar to like components of FIGS. 1, 2, and 3.

In the example of FIG. 4, sensing device 16 includes four magnetoresistive elements arranged as a Wheatstone bridge. A Wheatstone bridge may comprise a plurality of resistive elements coupled in a series configuration. A sensor element, for example, may comprise four resistors connected together in the form of a Wheatstone bridge, which may generate a temperature compensated output. In other examples, sensing device 16 may be half a Wheatstone bridge having two magnetoresistive resistors. A two element Wheatstone bridge, however, may achieve lower accuracy than a four element Wheatstone bridge.

For example, four magnetoresistive elements 60-1 through 60-4 are TMR based magnetic tunnel junction (MTJ) resistors that are arranged in a Wheatstone bridge configuration. Each of the resistive elements 60-1 through 60-4 may have a resistance that varies according to the magnitude and/or direction of a magnetic field that is incident upon the respective resistive element. The Wheatstone bridge configuration may generate one or more output voltage values that are indicative of the change in resistance caused by the amplitude and direction of the magnetic field. The one or more output voltages from sensing device 16 may be outputted as a detected signal indicative of an angular or linear position of a magnetic field source.

The resistive elements 60-1 through 60-4 may be TMR based MTJ resistors that may have insulating tunnel layers based on Aluminum Oxide ($Al_2O_3$), Magnesium Oxide (MgO), Hafnium Oxide ($HfO_2$), or other suitable insulating materials. The resistive element 60-1 through 60-4 may be based on other MR technologies or based on other suitable magnetic technologies in other examples. The type of material may be selected to meet an output requirement of a particular application that the rotary position sensor device is to be used for. In other examples, the resistive elements 60-1 through 60-4 within the Wheatstone bridge configuration may be formed from a Permalloy material.

In some examples, an insulating tunnel layer of each of resistive elements 60-1 through 60-4 may have a relatively high magnetoresistance ratio as compared with other types of magnetoresistive elements based on AMR or GMR technology. A magnetoresistance ratio may be a measure of the signal output of the sensor. For example, $Al_2O_3$ results in approximately 20% higher magnetoresistivity and MgO based resistive elements result in approximately 400% higher magnetoresistivity, compared with a 2-3% magnetoresistance ratio for an AMR sensor.

As illustrated in FIG. 4, sensing device 16 includes a single bridge sensor where each reference layer of the four resistive elements 60-1 through 60-4 are oriented as indicated by arrows. That is, the magnetization of the reference layer for resistor element 60-1 may be oriented in an approximately opposite direction, and away from, the magnetization of the reference layer for resistor element 60-2. The magnetization of the reference layer for resistive element 60-3 may be oriented in an approximately opposite direction, but towards, the magnetization of the reference layer for resistive element 60-4.

Figure 5:
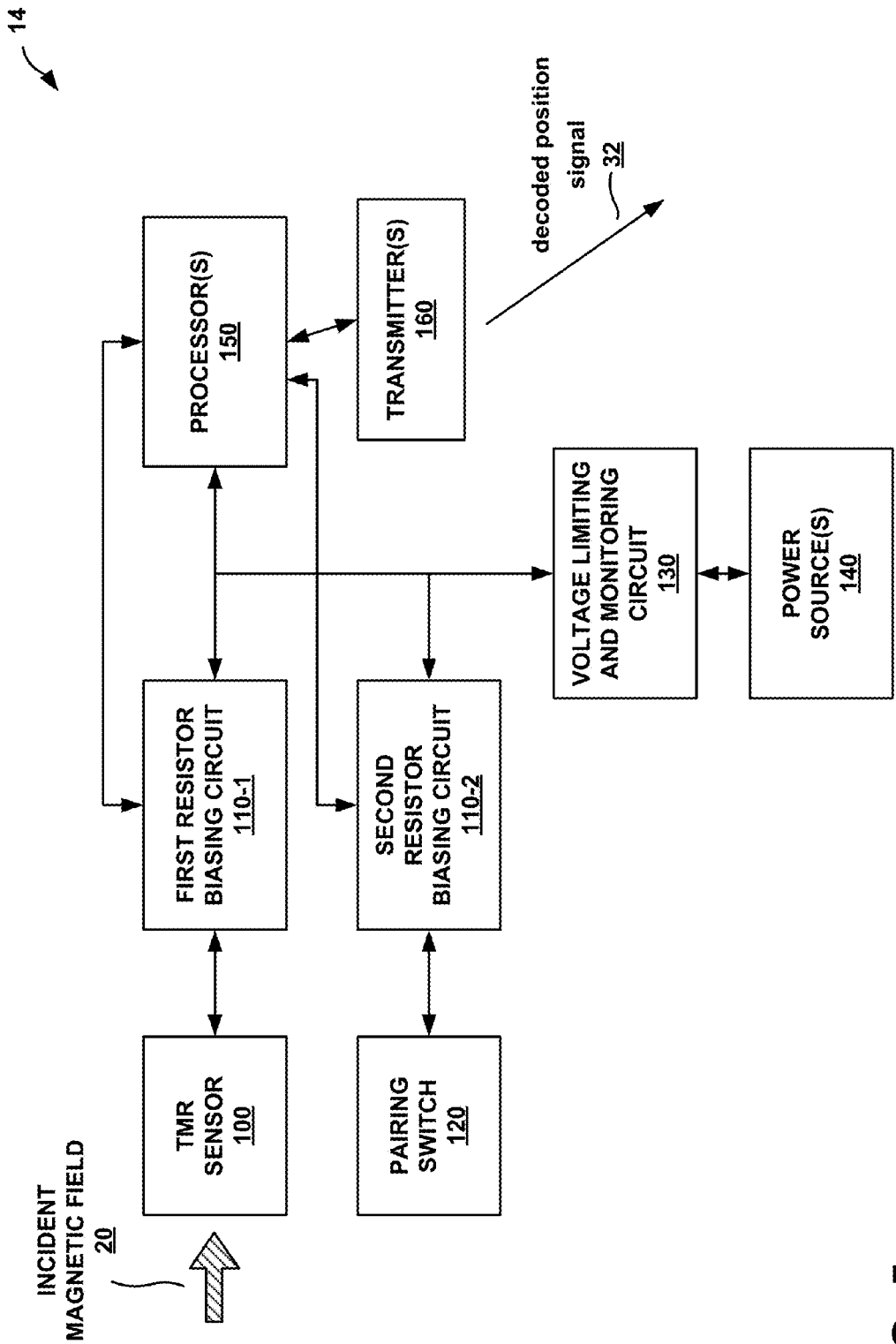
FIG. 5 is a schematic diagram illustrating one example of a position sensor, in accordance with one or more aspects of this disclosure.

FIG. 5 is a schematic diagram illustrating one example of a position sensor, in accordance with one or more aspects of this disclosure. FIG. 5 illustrates only one particular example of position sensor device 14, and many other examples of position sensor device 14 may be used in other instances. Position sensor device 14 may detect an incident magnetic field 20 and output a decoded position signal 32 related to an orientation of the incident magnetic field. Position sensor device 14 may be a linear position sensor or an angular position sensor.

Position sensor device 14 comprises a magnetic field position sensor, in this case, TMR sensor 100. TMR sensor 100 may be formed in a Wheatstone bridge configuration, comprising four resistors, each of which may include a ferromagnetic material that is susceptible to magnetoresistivity. Position sensor device 14 may include first and second biasing circuits 110-1 and 110-2, a pairing switch 120, a voltage limiting and monitoring circuit 130, one or more power sources 140, one or more processors 150, and one or more transmitters 160. As shown in FIG. 5, position sensor device 14 may comprise a wireless device. In examples where position sensor device 14 is a rotary position sensor, it may have approximately a ±90 degrees angular range. In other examples, different angular ranges may be achieved. In examples where position sensor device 14 is a linear position sensor, it may have approximately a ±10 mm linear range. In other examples, different linear ranges may be achieved.

TMR sensor 100 may be coupled to processor 150 through first resistor biasing circuit 110-1. Processor 150 may comprise a microprocessor, a microcontroller, a digital signal processor (DSP), an application specific integrated circuit (ASIC), a complementary metal-oxide-semiconductor (CMOS) circuit, a field-programmable gate array (FPGA), discrete logic circuitry, or any other suitable processor.

One or more power sources 140 may provide power to position sensor device 14, including providing power to TMR sensor 100. One or more power sources 140 may include one or more batteries, which may be rechargeable in some examples and provide voltage to TMR sensor 100 and processor 150. The one or more batteries may be made from nickel-cadmium, lithium-ion, or any other suitable material. In one example, power source 140 is a 3.6 volt (V) lithium battery. In other examples, an external power source provides power to position sensor device 14. TMR sensor 100 may operate with a current on the order of microwatts (µW). For example, TMR sensor 100 may draw approximately 5 µW from power source 140. Because TMR sensor 100 may require less power than other types of sensors, an example of position sensor device 14 including a TMR sensor may more easily achieve wireless capabilities. The current drawn by position sensor device 14 may be different in examples that use Hall, AMR, or GMR sensors. Voltage limiting and monitoring circuit 130 may regulate the power supplied to components of position sensor device 14. In some examples, there is no signal processing circuitry at the sensor side to reduce power consumption.

The movement of a biasing magnet, such as magnetic field source 12 of FIG. 1, generates a sinusoidal signal response from TMR sensor 100, referred to as a detected signal. TMR sensor 100 may output the detected signal indicative of an angular or linear position of an incident magnetic field, such as detected signal 26 of FIG. 1, to processor 150. In some examples, an angular or linear portion of the sinusoidal detected signal around a zero field may define input to processor 150 of the wireless circuitry. Processor 150 may receive detected signal 26 from TMR sensor 100 and convert the signal into decoded position signal 32.

When TMR sensor 100 passes in proximity to a magnetic field source, such as magnetic field source 12 of FIG. 1, a magnetic field may be incident upon TMR sensor 100, such as incident magnetic field 20. In examples where TMR sensor 100 is a Wheatstone bridge, incident magnetic field 20 exposes the resistive elements 60-1 through 60-4 to different levels of magnetoresistivity, based upon the strength and orientation of incident magnetic field 20 at the particular resistive element. For example, if incident magnetic field 20 is first incident upon resistive elements 60-2 and 60-4, the level of magnetoresistivity may be different for resistive elements 60-2 and 60-4 than for resistive elements 60-1 and 60-3. Detected signal 26 may be related to a difference voltage across the Wheatstone bridge of TMR sensor 100. A difference voltage between the resistive elements may indicate a position and orientation of incident magnetic field 20.

In the example of FIG. 5, processor 150 may comprise a microcontroller that includes an analog-to-digital converter (ADC). The microcontroller may be programmed to convert the analog detected signal from TMR sensor 100 to a digital signal. The microcontroller may also perform any offset correction on the digital signal. In some examples, the microcontroller may perform these operations on an approximately linear portion of the detected signal.

Processor 150 may further include circuitry to amplify the detected signal. Processor 150 may perform a Fourier series on the amplified detected signal. A Fourier series may be used to produce decoded position signal 32. Decoded position signal 32 may take one of many different forms, including a digital or analog signal. Other electrical output formats may be used, such as, for example, pulse width modulated (PWM) signals. Also, other techniques for signal conditioning of TMR sensor 100 are contemplated herein.

Processor 150 may be configurable for each application of position sensor device 14. In other examples, more than one processor 150 may be used in position sensor device 14. For example, a master-slave circuit can be employed to daisy-chain multiple processors together, for example, in systems where an array of position sensors are used. For example, position sensor device 14 may include an array of a plurality of sensing devices 16. In some examples, linear position sensors may also be used in conjunction with rotary position sensors.

The decoded position signal 32 is then wirelessly transmitted using transmitter 160. Transmitter 160 may be located on a same chip, mounting device, or substrate as TMR sensor 100. In some examples, position sensor device 14 comprises a single wireless chip. Position sensor device 14 utilizes one or more transmitters 160 to wirelessly communicate with a device external to position sensor device 14. Position sensor device 14 may include, or be communicatively coupled to, a transmitter 160. Transmitter 160 may comprise a network interface card for communicating with processor 150 or for receiving data from a storage device. In other examples, transmitter 160 may be an optical transceiver, a radio frequency transceiver, or any other type of device that can send and receive information. In one example, transmitter 160 may comprise an antenna.

Examples of a transmitter 160 may include Bluetooth®, 3G, WiFi®, very high frequency (VHF), and ultra high frequency (UHF) radios. Transmitter 160 may also be configured to connect to a wide-area network such as the Internet, a local-area network (LAN), an enterprise network, a wireless network, a cellular network, a telephony network, a Metropolitan area network (e.g., Wi-Fi, WAN, or WiMAX), one or more other types of networks, or a combination of two or more different types of networks (e.g., a combination of a cellular network and the Internet).

Position sensor device 14 may include further components in addition to or different from those shown in the example of FIG. 5. For example, position sensor device 14 may include an internal temperature reference component for temperature measurement and error correction of the signal generated from TMR sensor 100. Other configurations besides that shown in FIG. 5 are possible.

Position sensor device 14 may further include one or more storage devices for storing calibration coefficients for at least TMR sensor 100. A storage device may also include calibration data indicating a known shortest distance between magnetic field source 12 and sensing device 16 or a known magnetic field strength. These known values may be used to determine an absolute position of movable device 24 based on the detected signal. A storage device may also include one or more computer-readable storage media and may be configured for long-term storage of information. In some examples, a storage device may include non-volatile storage elements. Examples of such non-volatile storage elements may include, but are not limited to, magnetic hard discs, optical discs, floppy discs, flash memories, or forms of electrically programmable memories (EPROM) or electrically erasable and programmable (EEPROM) memories. In some examples, position sensor device 14 may include a storage device, such as an EEPROM, in order to store an initial position of incident magnetic field 20. The initial position may be used to determine the absolute angular or linear position of incident magnetic field 20.

Figure 6:
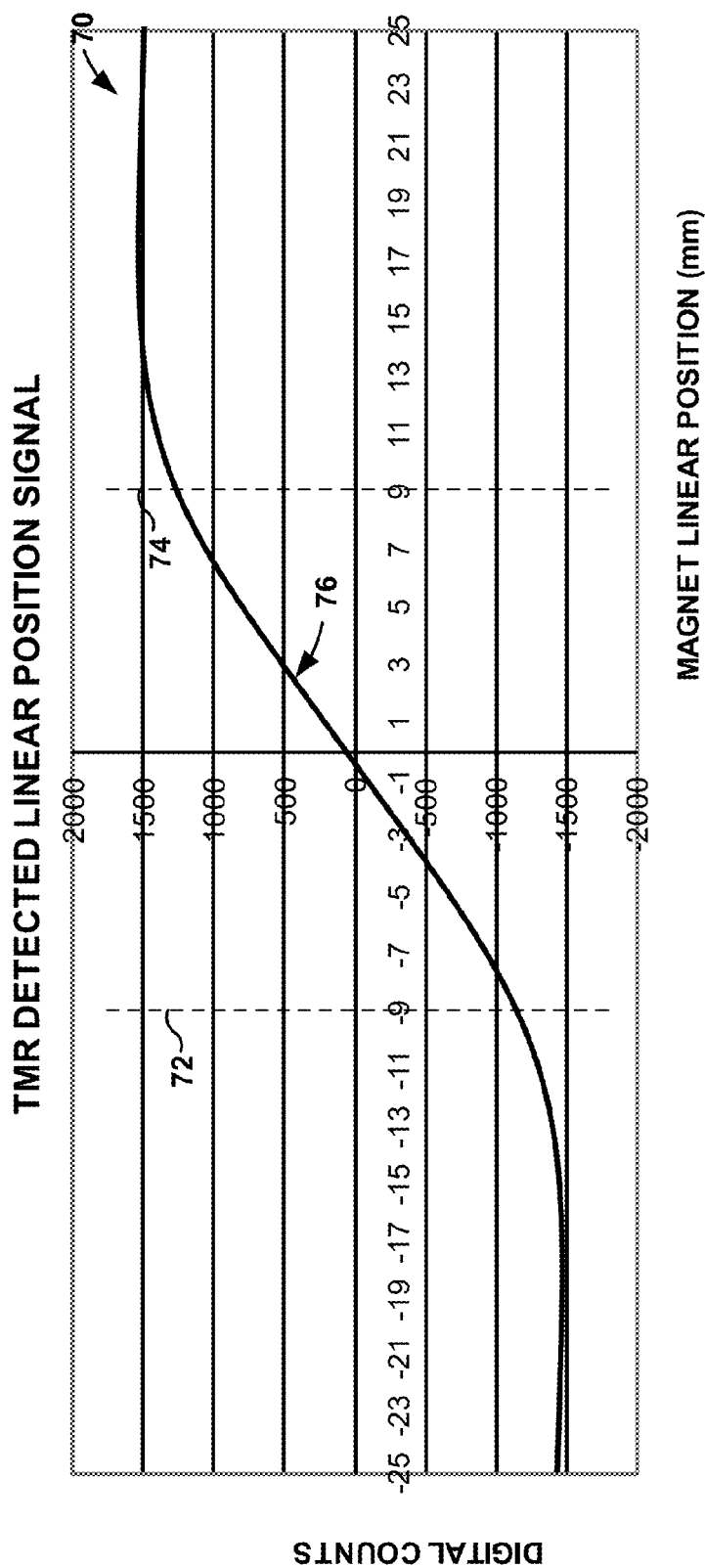
FIG. 6 is a graph illustrating example waveform generated by a linear position sensor detecting an incident magnetic field, in accordance with one or more aspects of this disclosure.

FIG. 6 is a graph illustrating example waveform 70 generated by a linear position sensor detecting an incident magnetic field, in accordance with one or more aspects of this disclosure. Waveform 70 may be generated by sensing device 16 of FIGS. 1 and 2, TMR sensor 34 of FIG. 4, or TMR sensor 100 of FIG. 5. The movement of a biasing magnet, such as magnetic field source 12 of FIG. 1, generates a sinusoidal signal response from a magnetoresistive sensor, such as TMR sensor 100 in a sensing device. This waveform 70 represents this sinusoidal signal, which is referred to herein as a detected signal. Waveform 70 may represent an analog signal.

A sensing device may generate detected signal 26, represented as waveform 70, which varies with respect to the linear position of incident magnetic field 20 according to a periodic function. The periodic function may be a sinusoidal function. As used herein, a sinusoidal function may refer to a function that oscillates like a sine function or a cosine function with respect to the linear position of incident magnetic field 20. The sine function or cosine function may be shifted, stretched, compressed, squared, etc.

The y-axis of the graph of FIG. 6 is measured in digital counts while the x-axis is measured in a length to indicate a linear position of the magnetic field source, such as mm along an axis a magnetic field source is with respect to the sensing device.

Waveform 70 includes an approximately linear portion 76, which is illustrated in FIG. 6 as being between lines 72 and 74. Linear portion 76 of the sinusoidal signal 70 around a zero field may be input into the processor of the linear position sensor device, such as processor 150 of position sensor device 14 of FIG. 5. For example, linear portion 76 is inputted into a microcontroller of a wireless linear position sensor device.

Figure 7:
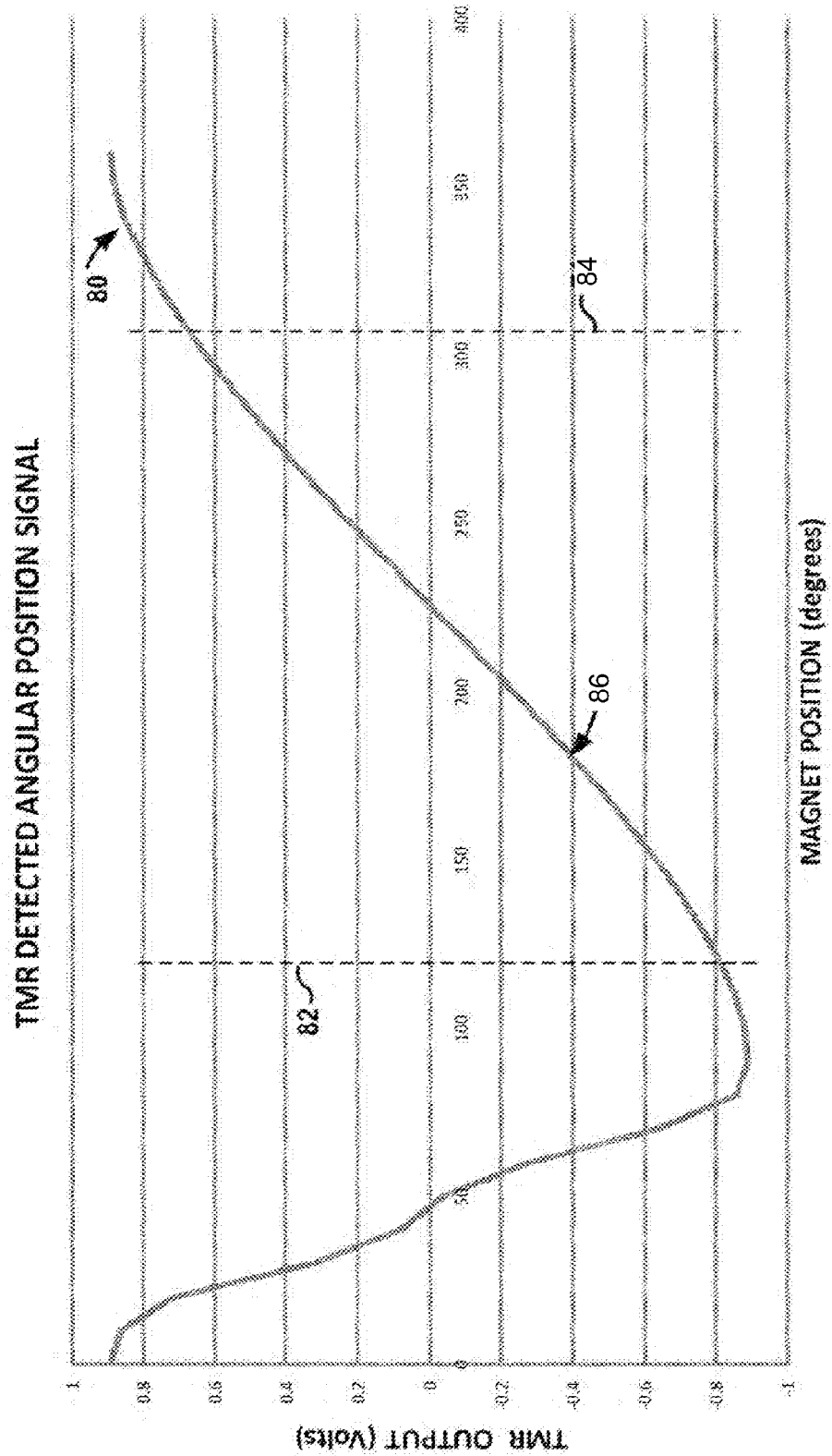
FIG. 7 is a graph illustrating example waveform generated by a rotary position sensor detecting an incident magnetic field, in accordance with one or more aspects of this disclosure.

FIG. 7 is a graph illustrating example waveform 80 generated by a rotary position sensor detecting an incident magnetic field, in accordance with one or more aspects of this disclosure. Waveform 80 may be generated by sensing device 16 of FIGS. 1 and 3, TMR sensor 34 of FIG. 4, or TMR sensor 100 of FIG. 5. The movement of a biasing magnet, such as magnetic field source 12 of FIG. 1, generates a sinusoidal signal response from a magnetoresistive sensor, such as TMR sensor 100 in a sensing device. Waveform 80 represents this sinusoidal signal, which is referred to herein as a detected signal. Waveform 80 may represent an analog signal.

A sensing device may generate detected signal 26, represented as waveform 80, which varies with respect to the angular position of incident magnetic field 20 according to a periodic function. The periodic function may be a sinusoidal function. As used herein, a sinusoidal function may refer to a function that oscillates like a sine function or a cosine function with respect to the angular position of incident magnetic field 20. The sine function or cosine function may be shifted, stretched, compressed, squared, etc.

The y-axis of the graph of FIG. 7 may indicate a TMR output measured in volts while the x-axis may indicate angular position of the magnetic field source measured in degrees. The angular position of the magnetic field source may range from approximately 0 degrees to approximately 360 degrees, representing a circle that magnetic field source sweeps through as it rotates.

Waveform 80 includes an approximately linear portion 86, which is illustrated in FIG. 7 as being approximately between lines 82 and 84. Linear portion 86 of the sinusoidal signal 80 around a zero field may be input into the processor of the rotary position sensor device, such as processor 150 of rotary position sensor device 50 of FIG. 3. For example, linear portion 86 is inputted into a microcontroller of a wireless rotary position sensor device.

Figure 8:
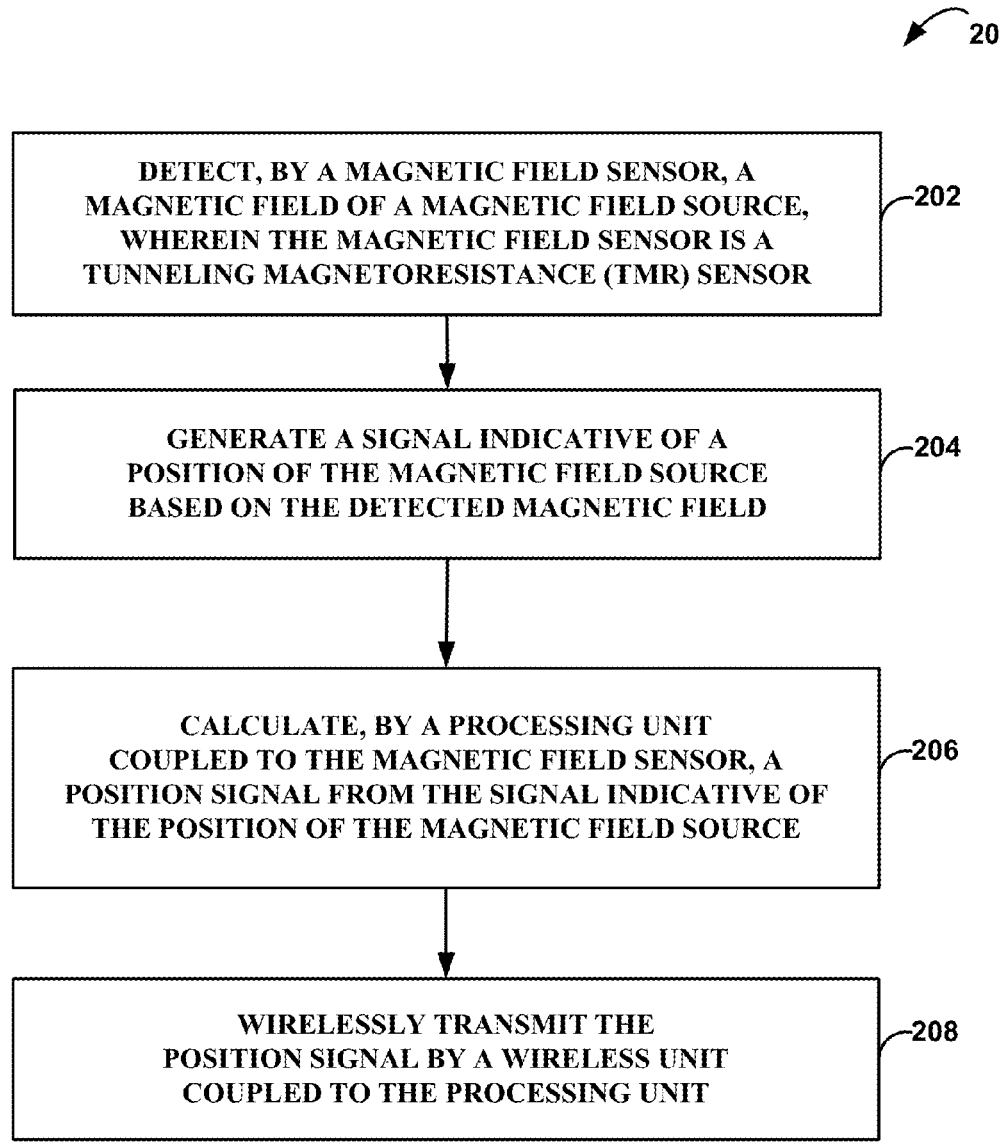
FIG. 8 is a flowchart illustrating an example method for determining a position of a magnetic field source, in accordance with one or more aspects of this disclosure.

FIG. 8 is a flowchart illustrating an example method 200 for determining a position of a magnetic field source, in accordance with one or more aspects of the present disclosure. Method 200 may be performed, for example, by position sensor device 14 of FIGS. 1 and 5, by linear position sensor 30 of FIG. 2, or by rotary position sensor 50 of FIG. 3. However, method 200 may be performed by other examples of a position sensor device in accordance with one or more aspects of the present disclosure.

Method 200 may include detecting, by a magnetic field sensor, such as TMR sensor 100, a magnetic field of a magnetic field source, wherein the magnetic field sensor is a tunneling magnetoresistance (TMR) sensor (202). The magnetic field sensor may detect incident magnetic field 20 of magnetic field source 12 as it passes TMR sensor 100. The magnetic field sensor generates a signal indicative of a position of the magnetic field source based on the detected magnetic field (204). A wireless unit coupled to the processing unit, such as transmitter 160, may wirelessly transmit the position signal (208).

A processing unit coupled to the magnetic field sensor may calculate a position signal from the signal indicative of the position of the magnetic field source (206). The processing unit may also calculate the position signal by determining a linear portion of the signal indicative of the position of the magnetic field source, digitizing the linear portion of the signal indicative of the position of the magnetic field source, and performing an offset correction to the linear portion.

The processing unit may further determine an initial position of the magnetic field source or incident magnetic field. A storage device may store data corresponding to the initial position. In some examples, the initial position may be determined using a second TMR sensor or another sensing device. This initial position of the magnetic field source may be combined with the position signal to determine an absolute position signal. That is, method 200 may further include the position sensor calculating an absolute position of the magnetic field based on the initial position of the magnetic field. The output signal indicative of a position of the magnetic field may be related to the absolute position of the magnetic field.

In the manners described above, the techniques of this disclosure may output a wireless angular position sensor with increased air gap capabilities. A magnetic field angular or rotary position sensor, such as a TMR sensor, a processor, and wireless circuitry may be packaged into a single device which may be located proximate to a magnetic field source. The direct use of analog output from a sensor device may provide increased resolution possibility which may be limited by the resolution of the wireless circuitry. In an example where the position sensor is a linear position sensor, an approximate 10 mm linear range is achieved with a single sensing chip. In an example where the position sensor is an angular position sensor, an approximate 180° angular range is achieved with a single sensing chip. These results are typically unachievable with Hall, AMR or GMR chips.

Techniques described herein may be implemented, at least in part, in hardware, software, firmware, or any combination thereof. For example, various aspects of the described embodiments may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described herein. In addition, any of the described units, modules or components may be implemented together or separately as discrete but interoperable logic devices. Depiction of different features as modules or units is intended to highlight different functional aspects and does not necessarily imply that such modules or units are realized by separate hardware, firmware, or software components. Rather, functionality associated with one or more modules or units may be performed by separate hardware, firmware, or software components, or integrated within common or separate hardware, firmware, or software components.

Techniques described herein may also be embodied or encoded in an article of manufacture including a computer-readable storage medium encoded with instructions. Instructions embedded or encoded in an article of manufacture including an encoded computer-readable storage medium, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may comprise one or more computer-readable storage media.

In some examples, computer-readable storage media may comprise non-transitory or tangible media. The term "non-transitory" may indicate that the storage medium is not embodied in a carrier wave or a propagated signal. In certain examples, a non-transitory storage medium may store data that can, over time, change (e.g., in RAM or cache). Further, the term "tangible" may indicate that the storage medium is not embodied in a carrier wave or a propagated signal.

Various aspects of the disclosure have been described. Aspects or features of examples described herein may be combined with any other aspect or feature described in another example. These and other examples are within the scope of the following claims.

What is claimed is:

1. A position sensor, comprising:
   a tunneling magnetoresistance (TMR) sensor configured to generate a detected signal in response to a magnetic field generated by a magnetic field source couplable to a movable device, wherein the detected signal includes an approximately linear portion with respect to a position of the movable device to which the magnetic field source is coupled;
   an integrated circuit electrically coupled to the TMR sensor, the integrated circuit configured to:
   i) receive the detected signal;
   ii) amplify the received detected signal; and,
   iii) generate a digital position signal based on the amplified signal corresponding to the approximately linear portion of the detected signal, wherein the detected signal is a substantially sinusoidal function, and the approximately linear portion occurs around a zero magnetic field; and,
   a wireless circuit electrically coupled to the integrated circuit, the wireless circuit configured to:
   i) receive the digital position signal; and,
   ii) radiate the received digital position signal to a device external to the position sensor.

2. The sensor of claim 1, wherein the TMR sensor is based on one of $Al_2O_3$, MgO, or $HfO_2$.

3. The sensor of claim 1, wherein the TMR sensor comprises at least part of a Wheatstone bridge.

4. The sensor of claim 3, wherein the at least part of the Wheatstone bridge comprises four resistive elements each comprising a magnetized reference layer, wherein a direction of magnetization of a reference layer for each resistive element in a first pair are directed towards each other, and wherein a direction of magnetization of a reference layer for each resistive element in a second pair are directed away from each other.

5. The sensor of claim 1, wherein an air gap between the magnetic field source and the TMR sensor is approximately 5 to 15 millimeters (mm)

6. The sensor of claim 1, wherein the integrated circuit, TMR sensor, and wireless circuit are co-located on a mounting device, and further comprises:
   a power source coupled at least to the TMR sensor, wherein the position sensor draws power on the order of microwatts.

7. The sensor of claim 1, wherein the position sensor is a linear position sensor and the position signal is a linear position signal.

8. The sensor of claim 7, wherein the linear position sensor defines a sensing range of approximately 10 mm.

9. The sensor of claim 1, wherein the position sensor is a rotary position sensor and the position signal is an angular position signal.

10. The sensor of claim 9, wherein the rotary position sensor defines a sensing range of approximately 180 degrees.

11. The sensor of claim 1, wherein the position sensor further comprises:

a power source at least coupled to the TMR sensor, and
wherein the wireless circuit comprises an antenna configured to radiate a radiated signal based on the position signal.

12. The sensor of claim 1, wherein the integrated circuit comprises one or more of a microcontroller, an application specific integrated circuit (ASIC), a field programmable gate array (FPGA), or a microprocessor.

13. The sensor of claim 1, wherein the position sensor comprises a chip oriented in a plane, wherein the magnetic field source is offset to the plane, and wherein the magnetic field is oriented approximately perpendicular to the plane.

14. A method for determining position, comprising:
   detecting, by a magnetic field sensor, a magnetic field of a magnetic field source, wherein the magnetic field sensor comprises a tunneling magnetoresistance (TMR) sensor;
   generating a signal indicative of a position of the magnetic field source based on the detected magnetic field;
   determining an approximately linear portion of the signal indicative of the position of the magnetic field source, wherein the generated signal is a substantially sinusoidal function, and the approximately linear portion occurs around a zero magnetic field;
   calculating, by a processing unit coupled to the magnetic field sensor, a position signal based on the approximately linear portion of the signal indicative of the position of the magnetic field source; and
   wirelessly transmitting the calculated position signal via a wireless unit coupled to a device external to the processing unit.

15. The method of claim 14, wherein calculating a position signal further comprises:
   determining a linear portion of the signal indicative of the position of the magnetic field source;
   digitizing the linear portion of the signal indicative of the magnetic field source; and
   performing an offset correction to the linear portion.

16. The method of claim 14, further comprising:
   determining an initial position of the magnetic field source; and
   combining the initial position of the magnetic field source with the position signal to determine an absolute position of the magnetic field source.

* * * * *